United States Patent
Liu et al.

(10) Patent No.: US 9,404,181 B2
(45) Date of Patent: Aug. 2, 2016

(54) PLASMA ENHANCED ATOMIC LAYER DEPOSITION SYSTEM

(75) Inventors: Bo-Heng Liu, Hsinchu Science Park (TW); Chi-Chung Kei, Hsinchu Science Park (TW); Meng-Yen Tsai, Hsinchu Science Park (TW); Wen-Hao Cho, Hsinchu Science Park (TW); Chih-Chieh Yu, Hsinchu Science Park (TW); Chien-Nan Hsiao, Hsinchu Science Park (TW); Da-Ren Liu, Hsinchu Science Park (TW)

(73) Assignee: NATIONAL APPLIED RESEARCH LABORATORIES, Hsinchu (TW)

( * ) Notice: Subject to any disclaimer, the term of this patent is extended or adjusted under 35 U.S.C. 154(b) by 1082 days.

(21) Appl. No.: 13/412,675

(22) Filed: Mar. 6, 2012

(65) Prior Publication Data

US 2013/0125815 A1  May 23, 2013

(30) Foreign Application Priority Data

Jul. 26, 2011 (TW) .............................. 100126276 A

(51) Int. Cl.
*C23C 16/00* (2006.01)
*C23C 16/455* (2006.01)

(52) U.S. Cl.
CPC ..... *C23C 16/45536* (2013.01); *C23C 16/45548* (2013.01)

(58) Field of Classification Search
CPC ................... C23C 16/45536; C23C 16/45548
USPC ................. 118/723 R, 723 IR, 719
See application file for complete search history.

(56) References Cited

U.S. PATENT DOCUMENTS

| | | | | |
|---|---|---|---|---|
| 5,725,674 A * | 3/1998 | Moustakas | ............ | C30B 29/403 118/715 |
| 5,879,459 A * | 3/1999 | Gadgil | .................... | C23C 16/44 118/715 |
| 6,261,408 B1 * | 7/2001 | Schneider | ........... | C23C 16/4412 118/715 |
| 6,835,919 B2 * | 12/2004 | Tolmachev | ....... | H01J 37/32357 156/345.37 |
| 2002/0157611 A1 * | 10/2002 | Bondestam | ........... | C23C 16/301 118/725 |
| 2004/0105935 A1 * | 6/2004 | Park | ........................ | C23C 16/40 427/255.28 |
| 2004/0182321 A1 * | 9/2004 | Kuibira | ............. | H01L 21/68792 118/728 |
| 2004/0222367 A1 * | 11/2004 | Ichiki | ....................... | H05H 1/46 250/251 |
| 2005/0093460 A1 * | 5/2005 | Kim | ...................... | H01J 37/321 315/111.21 |
| 2006/0060138 A1 * | 3/2006 | Keller | ................. | H01J 37/3244 118/715 |
| 2012/0012049 A1 * | 1/2012 | Hsu | ....................... | C23C 16/303 117/98 |

* cited by examiner

Primary Examiner — Keath Chen
(74) Attorney, Agent, or Firm — Chun-Ming Shih

(57) ABSTRACT

A plasma enhanced atomic layer deposition (PEALD) system used to form thin films on substrates includes a plasma chamber, a processing chamber, two or more ring units and a control piece. The plasma chamber includes an outer and an inner quartz tubular units, whose central axes are aligned with each other. Therefore, plasma is held and concentrated in an annular space formed between the outer and outer quartz tubular units. Due to the first and second through holes, the plasma flow may be more evenly distributed on most of the surface of the substrate to form evenly distributed thin films and nano particles on the substrate. In addition, due to the alignment and misalignment between the first and second through holes, the plasma generated in the plasma chamber may be swiftly allowed or disallowed to enter to the processing chamber to prevent the precursor from forming a CVD.

10 Claims, 4 Drawing Sheets

PLASMA ENHANCED ATOMIC LAYER DEPOSITION SYSTEM

BACKGROUND OF THE INVENTION

1. Field of the Invention

The invention generally relates to an atomic layer deposition (ALD) system. More particularly, the invention relates to an improved plasma enhanced atomic layer deposition (PEALD) system.

2. Description of the Prior Art

The technology of ALD (atomic layer deposition) has been developed to form thin dielectric films on substrates. In the method of ALD, gas chemically reacts with the surface of a substrate and attaches to it to form a layer with the atom-scale thickness thanks to the self-limiting characteristic of such reaction. In comparison to the traditional film forming technology, the technology of ALD has the advantages of higher coverage rate and more evenness in the thickness of the films.

To lower the necessary temperature in the film forming process, the technology of PEALD (plasma enhanced atomic layer deposition) has been developed. In comparison to the technology of ALD, the technology of PEALD has the advantages of lower temperature in the process, smoother surface of the thin films, better conductive properties and shorter time in production. In the PEALD system of the prior art, the PEALD system comprises a single quartz tubular unit, a processing chamber and a gate valve. The single quartz tubular unit is in communication with the processing chamber. The gate valve is provided on the single quartz tubular unit so as to control the entry of plasma and thus the formation of the ALD on the substrates.

In addition, in the forming process, the gate valve has to be opened and closed frequently to avoid the precursor from forming a chemical vapor deposition (CVD) on a substrate. Therefore, before the gate valve is closed, a small amount of the precursor may already enter the quartz tubular unit and then react with the plasma to form a CVD. In such case, the thin films of the finished substrates may be adversely affected. Moreover, the gate valve does not have a diffusion design so that plasma flowing from the gate valve can not evenly distribute on the entirety of a substrate. This adversely affects the quality of the finished substrates. In addition, because the gate valve is opened and closed frequently, the maintenance cost of the gate valve is quite high.

To eliminate these disadvantages, the inventor of the present invention has put a lot of effort into the subject and has successfully come up with the improved PEALD system of the present invention.

SUMMARY OF THE INVENTION

The object of the present invention is to provide an improved PEALD system that can eliminate the aforesaid disadvantages in the prior art.

To reach the object, the improved PEALD system of the present invention is disclosed. The improved PEALD system (which is used to form thin films on substrates) of the present invention comprises a plasma chamber, a processing chamber, a first ring unit, a second ring unit and a control piece. The plasma chamber includes an outer quartz tubular unit and an inner quartz tubular unit, whose central axis is aligned with that of the outer quartz tubular unit. Plasma is generated in an annular space formed between the outer quartz tubular unit and inner quartz tubular unit. A plasma outlet is formed at either lower end of the plasma chamber to allow the exit of the plasma generated in the annular space. A substrate may be placed in the processing chamber. The processing chamber has a circular precursor inlet unit and a circular nitrogen inlet unit and is in communication with the plasma outlet. The precursor may be let in through the circular precursor inlet unit and may react with the substrate. The circular nitrogen inlet unit is provided over the circular precursor inlet unit to provide nitrogen flowing downwards to the circular precursor inlet unit. The first ring unit is disposed at the junction between the plasma chamber and the processing chamber and a plurality of first through holes are circumferentially disposed in the first ring unit. The second ring unit is disposed under the first ring unit and a plurality of second through holes are circumferentially disposed in the second ring unit. Each of the second through holes has a diameter greater than that of each of the first through holes. The control piece is disposed inside the processing chamber and may cause the second ring unit to rotate in a reciprocating manner with respect to the first ring unit so as to align and misalign the second through holes with the first through holes and hence to open and close the passage between the processing chamber and the plasma chamber. When the second through holes align with the first through holes, the plasma generated in the plasma chamber may go through the plasma outlet, first through holes and second through holes to reach the processing chamber and act on the substrate. When the second through holes misalign with the first through holes, the plasma generated in the plasma chamber may not go through the second through holes to reach the processing chamber.

In summary, the improved PEALD system of the present invention is used to form thin films on substrates. The improved PEALD system of the present invention comprises a plasma chamber, a processing chamber, a first ring unit, a second ring unit and a control piece. The plasma chamber includes an outer quartz tubular unit and an inner quartz tubular unit, whose central axis is aligned with that of the outer quartz tubular unit. Because plasma is generated in an annular space, plasma is more concentrated as compared to the PEALD system of the prior art. Thanks to the first through holes and the second through holes, plasma may be more evenly distributed on most of the surface of the substrate to form evenly distributed thin film and nano particles on the substrate. In addition, thanks to the alignment and misalignment between the first through holes and the second through holes, the plasma generated in the plasma chamber may be swiftly allowed or disallowed to enter to the processing chamber to prevent the precursor from forming a CVD (chemical vapor deposition).

Therefore, in the improved PEALD system of the present invention, such gate valve is not used to block the entry of plasma into the processing chamber. Therefore, the high cost in the repair and maintenance of the gate valve may be avoided.

These features and advantages of the present invention will be fully understood and appreciated from the following detailed description of the accompanying Drawings.

DETAILED DESCRIPTION OF THE PREFERRED EMBODIMENT

Figure 1:
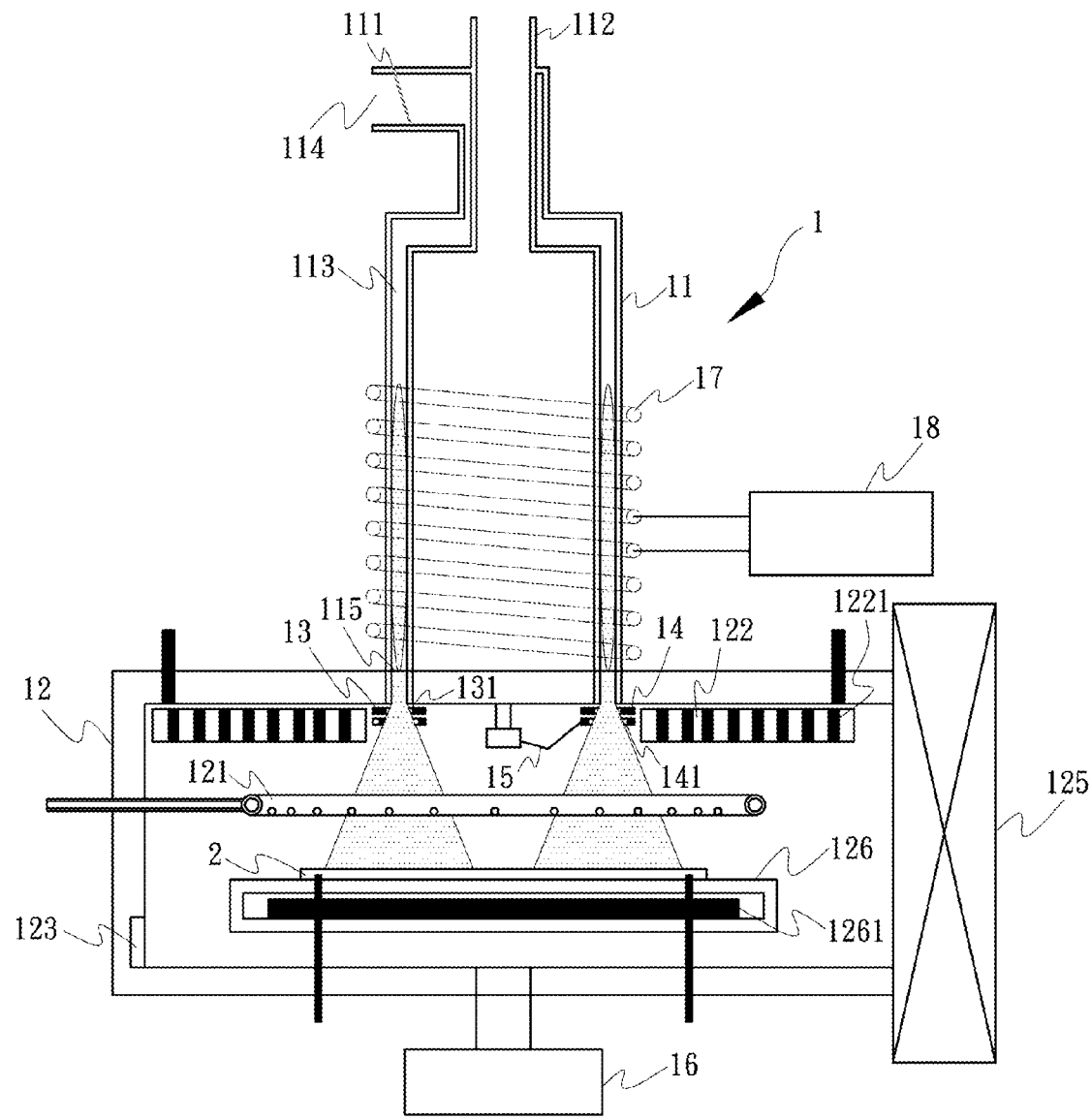
FIG. 1 is a sectional view of an embodiment of the improved PEALD system of the present invention.

Although a preferred embodiment of the present invention will be described in detail in the following, it should be understood that the preferred embodiment is to be regarded in an illustrative manner rather than a restrictive manner, and all variations and modifications of the basic inventive concepts herein taught still fall within the scope of the present invention.

To eliminate the disadvantages of the PEALD system of the prior art, an improved PEALD system is disclosed in the present invention. The improved PEALD system is used to form nano films and nano particles on substrates. Please see FIG. 1, which illustrates the structure of the improved PEALD system of the present invention. The improved PEALD system of the present invention comprises a plasma chamber 11, a processing chamber 12, a first ring unit 13, a second ring unit 14 and a control piece 15. The plasma chamber 11 includes an outer quartz tubular unit 111 and an inner quartz tubular unit 112, whose central axis is aligned with that of the outer quartz tubular unit 111. Plasma is generated in the annular space 113 formed between the outer quartz tubular unit 111 and inner quartz tubular unit 112. Because plasma is generated in the annular space 113, plasma is more concentrated as compared to that in the PEALD system of the prior art. A gas inlet 114 is provided on the plasma chamber 11 to let gas, such as argon, oxygen, nitrogen, a mixture of argon and hydrogen, ammonia, etc. into the circular space 113. An RF power supply 18 may supply electricity to generate plasma in the plasma chamber 11. In operation, gaseous argon is let into the plasma chamber 11 through the gas inlet 114 so that plasma may be generated steadily. Because argon is an inert gas and does not participate in the reaction, the presence of argon does not affect the formation of the atomic layer deposition. Also, the presence of argon can enable the plasma to be lit more easily. In addition, gaseous nitrogen may be provided in the inner quartz tubular unit 112 to avoid the formation of plasma in the inner quartz tubular unit 112.

Also, a spiral cooling copper pipe 17 surrounds the outer quartz tubular unit 111 to cool the plasma chamber 11 with the water running in the pipe 17 to keep the plasma chamber 11 in a suitable temperature range so that the plasma chamber 11 will not be damaged due to overheating. A plasma outlet 115 is formed at either lower end of the plasma chamber 11 to allow the exit of the plasma generated in the annular space 113.

A substrate 2 may be placed in the processing chamber 12. The processing chamber 12 has a circular precursor inlet unit 121 and a circular nitrogen inlet unit 122 and is in communication with the plasma outlets 115. The precursor may be let in through the circular precursor inlet unit 121 and may chemically react with the substrate 2. As illustrated in FIG. 1, the circular nitrogen inlet unit 122 is provided over the circular precursor inlet unit 121 to provide nitrogen flowing downwards to the circular precursor inlet unit 121 and curb the backward flow of the precursor let out from the circular precursor inlet unit 121 so as to curb the formation of the a CVD (chemical vapor deposition) of the precursor. A plurality of spaced apart holes 1221 are provided in the circular nitrogen inlet unit 122 so that the nitrogen flow can cover the entirety of the circular precursor inlet unit 121.

A vacuum pump 16 is connected with the processing chamber 12 to lower the pressure in the processing chamber 12 and the plasma chamber 11. The pressure is preferably within the rage from 2 to 10 Torr. The processing chamber 12 has a heating device 123, which may keep the temperature within the processing chamber 12 within the range from 70 to 100 degree C., so as to prevent the precursor released from the circular precursor inlet 121 from condensing and depositing on the inner walls of the processing chamber 12.

A gate valve 125 and a substrate platform 126 may also be provided. The gate valve 125 may be connected with another processing chamber (not shown in the drawings) in a cluster system. The substrate platform 126 may carry a substrate. A heating coil 1261 made of molybdenum is disposed inside the substrate platform and may heat up the substrate 2 carried on the substrate platform 126. In this embodiment, the heating coil 1261 may reach 500 degree C.

Figure 2:
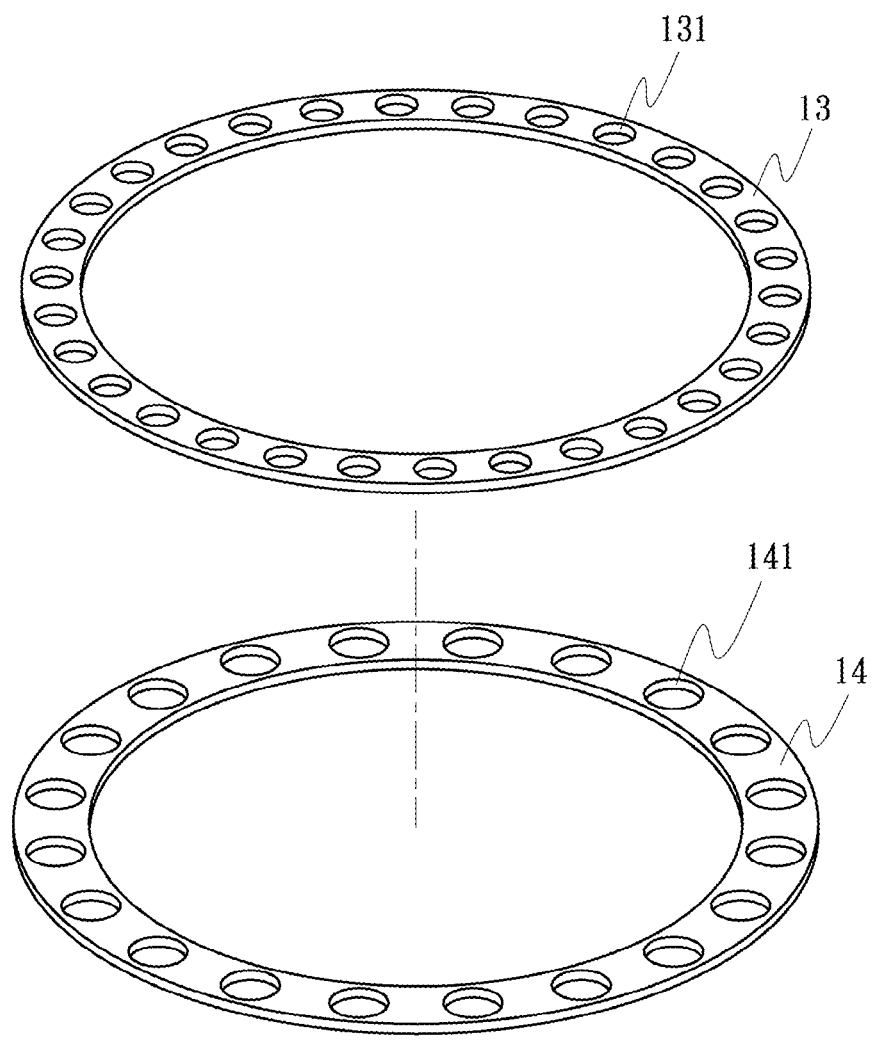
FIG. 2 is an enlarged perspective view of the first ring unit and the second ring unit of the improved PEALD system of the present invention.

Please refer to both FIG. 1 and FIG. 2. The first ring unit 13 is disposed at the junction between the plasma chamber 11 and the processing chamber 12. A plurality of first through holes 131 are circumferentially disposed in the first ring unit 13. The second ring unit 14 is disposed under the first ring unit 13. A plurality of second through holes 141 are circumferentially disposed in the second ring unit 14. Each of the second through holes 141 has a diameter greater than that of each of the first through holes 131. Preferably, each of the second through holes 141 has a diameter that is up to two times of that of each of the first through holes 131.

The control piece 15 is disposed inside the processing chamber 12 and may cause the second ring unit 14 to rotate in a reciprocating manner with respect to the first ring unit 13 so as to align and misalign the second through holes 141 with the first through holes 131 and hence to open and close the passage between the processing chamber 12 and the plasma chamber 11. The control piece 15 may be a lever device and may be used to achieve the aforesaid purpose. In an embodiment of the present invention, the range of such rotational reciprocating motion is for each of the second through holes 141 to rotate two of the first through holes 131 so that no additional components, such as cogwheel, are needed in the control piece 15. If such control piece 15 has a more complicated design, the precursor may form a CVD (chemical vapor deposition) on the control piece 15.

Figure 3:
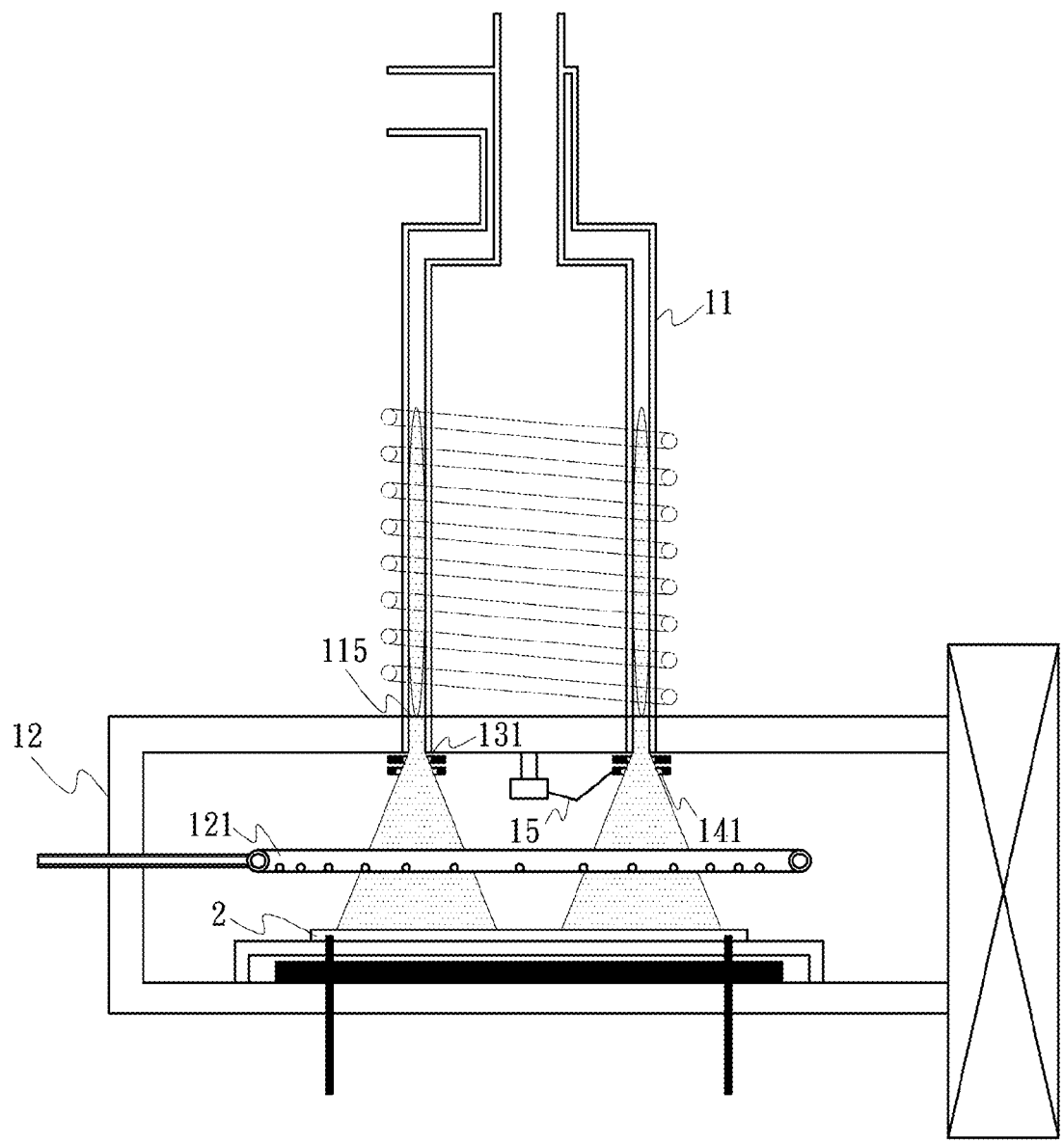
FIG. 3 is a sectional view of the improved PEALD system of the present invention to illustrate the operation of the improved PEALD system of the present invention when the second through holes align with the first through holes.
Figure 4:
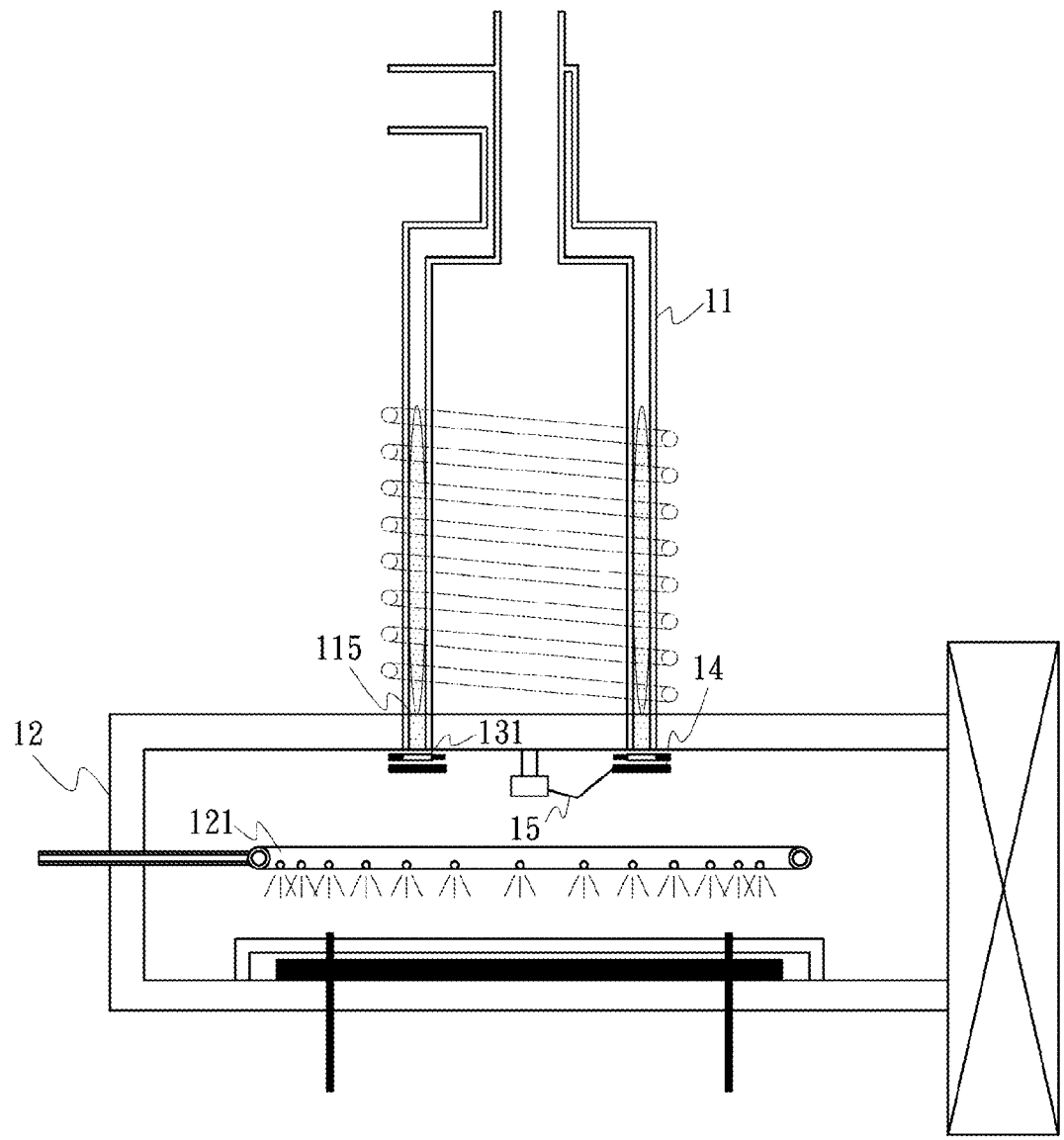
FIG. 4 is a sectional view of the improved PEALD system of the present invention to illustrate the operation of the improved PEALD system of the present invention when the second through holes misalign with the first through holes.

Please refer to both FIG. 3 and FIG. 4, which illustrate the operation of the improved PEALD system of the present invention when the second through holes 141 align and misalign with the first through holes 131, respectively. As illustrated in FIG. 3, when the second through holes 141 align with the first through holes 131, the plasma generated in the plasma chamber 11 may go through the plasma outlet 115, first through holes 131 and second through holes 141 to reach the processing chamber 12 and the substrate 2. At such moment, the circular precursor inlet unit 121 stops the release of the precursor to avoid the plasma from acting on the precursor. Because each of the second through holes 141 is larger than each of first through holes 131, the plasma flow passing the second through holes 141 may have a gradually-increasing cross section until it reach the substrate platform 126. In other words, the plasma flow passing the second through holes 141 may form several upside-down funnel-shaped plasma bundles so that the plasma flow may be more evenly distributed on the substrate 2. Preferably, such plasma flow, after it passes the first ring unit 13 and second ring unit 14, may cover one quarter to three quarters of the entire surface of the substrate platform 126.

As illustrated in FIG. 4, when the second through holes 141 misalign with the first through holes 131, the plasma generated in the plasma chamber 11 may not go through the second through holes 141 to reach the processing chamber 12. Now, the circular precursor inlet unit 121 releases the precursor into the processing chamber 12.

In summary, the improved PEALD system of the present invention is used to form thin films on substrates. The improved PEALD system of the present invention comprises a plasma chamber, a processing chamber, a first ring unit, a second ring unit and a control piece. The plasma chamber includes an outer quartz tubular unit and an inner quartz tubular unit, whose central axis is aligned with that of the outer quartz tubular unit. Because plasma is generated in the annular space, plasma is more concentrated as compared to the PEALD system of the prior art. Thanks to the first through holes and the second through holes, the plasma flow may be more evenly distributed on most of the surface of the substrate. In addition, thanks to alignment and misalignment between the first through holes and the second through holes, the plasma generated in the plasma chamber may be allowed or disallowed to enter to the processing chamber to prevent the precursor from forming a CVD.

In the PEALD system of the prior art, such gate valve is not used to control the entry of the plasma into the processing chamber. Therefore, such gate valve may need to be repaired or replaced periodically and hence increase the cost of operation. On the other hand, in the improved PEALD system of the present invention, such gate valve is not used to prevent plasma from entering into the processing chamber; therefore, the cost in operation is lowered.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A plasma enhanced atomic layer deposition (PEALD) system, which is used to form thin films on substrates, comprising:
   a plasma chamber, which includes an outer quartz tubular unit and an inner quartz tubular unit, whose central axis is aligned with that of the outer quartz tubular unit, wherein plasma is generated in an annular space formed between the outer quartz tubular unit and the inner quartz tubular unit, and wherein a plasma outlet is formed at a lower end of the plasma chamber to allow the exit of the plasma generated in the annular space;
   a processing chamber, wherein a substrate is placed in the processing chamber, and wherein the processing chamber has a circular precursor inlet unit and a circular nitrogen inlet unit and is in communication with the plasma outlet, and wherein a precursor is introduced through the circular precursor inlet unit and reacts with the substrate, and wherein the circular nitrogen inlet unit is provided over the circular precursor inlet unit to provide nitrogen flowing downwards to the circular precursor inlet unit;
   a first ring unit, disposed at a junction between the plasma chamber and the processing chamber, wherein a plurality of first through holes are circumferentially disposed in the first ring unit;
   a second ring unit, disposed under the first ring unit, wherein a plurality of second through holes are circumferentially disposed in the second ring unit and each of the second through holes has a diameter greater than that of each of the first through holes; and
   a control piece, disposed inside the processing chamber, wherein the control piece causes the second ring unit to rotate in a reciprocating manner with respect to the first ring unit so as to align and misalign the second through holes with the first through holes and hence to open and close a passage between the processing chamber and the plasma chamber,
   wherein when the second through holes align with the first through holes, the plasma generated in the plasma chamber may go through the plasma outlet, first through holes and second through holes to reach the processing chamber and act on the substrate and when the second through holes misalign with the first through holes, the plasma generated in the plasma chamber may not go through the second through holes to reach the processing chamber;
   wherein the circular nitrogen inlet unit is located inside the processing chamber to surround the first ring unit and the second ring unit in a same plane, and because the second through hole is larger than the first through hole, a plasma flow passing the second through hole has a gradually-increasing cross section until the plasma flow reaches the substrate, that is, the plasma passing the second through holes forms a plurality of upside-down funnel-shaped plasma bundles so that the plasma is more evenly distributed on the substrate.

2. The PEALD system as in claim 1, wherein the inner quartz tubular unit contains gaseous nitrogen.

3. The PEALD system as in claim 1, wherein a gas inlet is provided on the plasma chamber to let gas, such as argon, oxygen, nitrogen, a mixture of argon and hydrogen, ammonia, etc. into the annular space so as to convert such gas into plasma.

4. The PEALD system as in claim 1, wherein a plurality of spaced apart holes are provided in the circular nitrogen inlet unit so that the nitrogen flow can cover the entirety of the circular precursor inlet unit.

5. The PEALD system as in claim 1, wherein a vacuum pump is connected with the processing chamber to lower the pressure in the processing chamber and the plasma chamber.

6. The PEALD system as in claim 1, wherein the processing chamber has a heating device, which may heat up the inner walls of the processing chamber to prevent the precursor from condensing and depositing on the inner walls of the processing chamber.

7. The PEALD system as in claim 1, wherein a spiral cooling copper pipe surrounds the outer quartz tubular unit to cool the plasma chamber with the water running in the pipe.

8. The PEALD system as in claim 1, wherein the plasma chamber also has an RF power supply, which may supply electricity to the plasma chamber so as to generate plasma in the annular space of the plasma chamber.

9. The PEALD system as in claim 1, wherein a gate valve and a substrate platform may also be provided in the processing chamber, and wherein the gate valve is connected with another processing chamber in a cluster system and the substrate platform may carry a substrate, and wherein a heating coil made of molybdenum is disposed inside the substrate platform.

10. The PEALD system as in claim 1, wherein each of the second through holes has a diameter that is up to two times of that of each of the first through holes.

* * * * *